(12) United States Patent
Ingman et al.

(10) Patent No.: US 8,368,384 B2
(45) Date of Patent: Feb. 5, 2013

(54) REDUCTION OF SEMICONDUCTOR STRESSES

(75) Inventors: Kjell Ingman, Söderkulla (FI); Kari Tikkanen, New Berlin, WI (US); Tomi Väisälä, Espoo (FI); Kai Johansson, New Berlin, WI (US)

(73) Assignee: ABB OY, Helsinki (FI)

(*) Notice: Subject to any disclaimer, the term of this patent is extended or adjusted under 35 U.S.C. 154(b) by 1182 days.

(21) Appl. No.: 12/208,593

(22) Filed: Sep. 11, 2008

(65) Prior Publication Data
US 2010/0060328 A1    Mar. 11, 2010

(51) Int. Cl.
*G01R 1/44* (2006.01)
(52) U.S. Cl. ........................................ 324/105
(58) Field of Classification Search .................. None
See application file for complete search history.

(56) References Cited

U.S. PATENT DOCUMENTS
8,106,333 B2 * 1/2012 Kangas ................ 219/260

* cited by examiner

*Primary Examiner* — Jermele M Hollington
*Assistant Examiner* — Trung Nguyen
(74) *Attorney, Agent, or Firm* — Buchanan Ingersoll & Rooney, P.C.

(57) ABSTRACT

A method of reducing thermal stresses of a semiconductor component in a frequency converter, an arrangement in a frequency converter, and a frequency converter, wherein the semiconductor component is attached to a cooling element for cooling the semiconductor component and one or more resistive elements are attached to the cooling element. In the method, the cooling element is heated by the one or more resistive elements attached thereto by supplying current from the frequency converter through the one or more resistive elements for obtaining an elevated lowest temperature for the semiconductor component and thereby reducing the amount of temperature change between the highest and the lowest temperatures in the semiconductor component during use of the frequency converter.

24 Claims, 2 Drawing Sheets

REDUCTION OF SEMICONDUCTOR STRESSES

FIELD OF THE INVENTION

The present invention relates to reduction of semiconductor stresses, and more particularly to reduction of semiconductor stresses caused by temperature variations in a semiconductor component.

BACKGROUND OF THE INVENTION

A frequency converter is an electric device with which it is possible to feed a load with a voltage that has a variable frequency. Frequency converters are typically used with motors to control them at an altering frequency or when transferring electric power back to the network, in which case the converter generates a voltage whose frequency corresponds to that of the network.

Today, IGB transistors (Insulated Gate Bipolar Transistor, IGBT), which are fast, gate-controlled components, are typically used as power semiconductors of converters, i.e. switch components generating the output voltage. The current-carrying capacity of the largest IGBT components is several hundreds of amperes and their maximum voltage is thousands of volts. In frequency converters, switch components are used purely as switches, in which case they have two states, i.e. fully conducting and fully blocking, in practice. Changing states is carried out as fast as possible to avoid a concurrent voltage and current in the component.

The IGBT mentioned herein is a component made up of several parts and, at the same time, of several pieces having different thermal resistances. The semiconductor components can be considered to be formed by a baseplate, substrate, and the actual semiconductor elements, i.e. chips. The function of the baseplate is to conduct heat generated in the component to cooling elements, such as heat sinks or the like. The substrate is on top of the baseplate and the chip is fastened thereto. It is clear that the chip, being a resistive component, heats up the fastest and the most due to the current running through the component. The baseplate, in turn, heats up the slowest and the least of the component parts, i.e. it has the highest temperature time constant in part due to cooling and in part due to the distribution of heat to the large volume of the baseplate.

The different parts of the semiconductor components have not only different temperature time constants, but also different thermal expansion coefficients. A thermal expansion coefficient indicates the size of expansion caused by a temperature change in an object. Because the parts of a semiconductor component are tightly together, often soldered, mechanical forces occur between them due to expansions of different sizes and strain the component and eventually destroy it.

This problem of heat stress is especially serious when power semiconductors are loaded in cycles. A cyclic load refers to a load that is not even, but is formed by situations in which a power semiconductor's load is high for a time and low thereafter. Such a load generates a lot of temperature variation in the power semiconductor as the temperature rises strongly during a high load, i.e. current, and drops as the load is reduced. Such a cyclic load ages a power semiconductor prematurely.

Examples of cyclic drives of an inverter include crane, centrifuge and lift drives. For instance in centrifuge drives, an inverter controls the motor to rotate the centrifuge that requires a high torque to accelerate, which means a high current and a high temperature increase in the semiconductor. After acceleration, the centrifuge is rotated at an operating speed, in which case the output current of the inverter decreases significantly as the required torque decreases. The semiconductor component that heated up during the acceleration now starts to cool. If the centrifuge is further slowed regeneratively, i.e. by using the motor as a generator, a high current again passes through the switch components and the components heat up. The same applies to lift and crane drives and other cyclic drives.

One current method of dimensioning drives is to carry it out on the basis of the semiconductor temperature variation, i.e. amplitude, caused by the cyclic load. Semiconductor manufacturers indicate a probable number of cycles endured by the semiconductor as a function of temperature variation. As the temperature variation decreases, the allowed maximum number of cycles increases.

Today, frequency converters, like other electric devices, are cooled actively by fans or liquid cooling. In such solutions, heat is transferred away from the device to cool the components of the device that heat up. Generally, the power semiconductor components are attached to a cooling element, such as heat sinks or the like. Further, the temperature is kept low by utilizing forced air or liquid in connection with the heat sink. Usually constant cooling is used, in which case, despite the temperature of the power semiconductors, a cooling fan or pump operates at a constant rotation rate. In some solutions, it is also known to use cooling that changes directly according to temperature, in which case, as the production of heat increases, cooling power is increased to restrict the maximum temperature.

It is clear that by using a fan to cool the components, the maximum temperature of the components can be brought down. Thus, the operation of the fan is taken into account when dimensioning the power semiconductors such that the highest allowable temperature of the component will not be exceeded.

The use of forced air or liquid cooling only does not, however, make it possible to decrease the temperature profile, i.e. the difference between the highest and the lowest temperatures of the component, so as to avoid problems caused by temperature changes especially in cyclic drives.

BRIEF DESCRIPTION OF THE INVENTION

An object of the present invention to provide a method and an arrangement for implementing the method and a frequency converter so as to overcome the above problems. The objects of the invention are achieved by a method, an arrangement and a frequency converter which are characterized by what is stated in the independent claims. Preferred embodiments of the invention are disclosed in the dependent claims.

The invention is based on the idea of reducing the temperature variations by utilizing a resistor to heat the cooling element. The cooling element is heated during the use of the component so that when the frequency converter is not utilized at high power, the power semiconductor component is still kept at a certain temperature which is higher than the temperature the component would reach if the heating were removed.

The invention is based on realizing that in order to minimize the semiconductor stresses, the lowest temperatures of the semiconductor component have to be raised. The highest allowable temperature of a power semiconductor component is a design parameter for rating the component, and this temperature cannot be easily lowered without having to over-rate the component.

An advantage of the method and device of the invention is that the semiconductor stresses caused by temperature variations can be reduced considerably. This can be accomplished by minimal changes to the devices and without having to overrate the cooling arrangements of the component. The method and device of the invention are particularly advantageous in connection with cyclic use of frequency converters where the temperature variations caused by load changes have been shortening the service life of the components drastically.

BRIEF DESCRIPTION OF THE DRAWINGS

In the following, the invention will be described in greater detail by means of preferred embodiments and with reference to the accompanying drawings, in which.

DETAILED DESCRIPTION OF THE INVENTION

Figure 1:
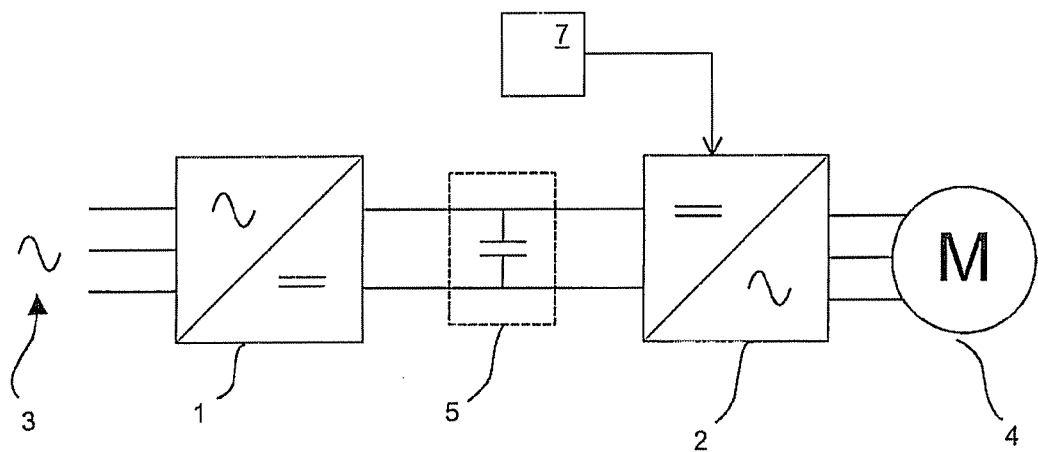
FIG. 1 illustrates a frequency converter.

FIG. 1 shows a basic structure of a frequency converter. The frequency converter comprises a rectifier 1 which rectifies the supplying alternating voltage of the mains 3. Rectified voltage is fed to a DC bus or DC intermediate circuit 5, which comprises one or more capacitors 6 for storing and smoothing the rectified voltage. The rectified voltage is in turn fed to an inverter 2 which is capable of supplying alternating voltage with a desired frequency to a load, such as a motor 4. In FIG. 1, both the mains 3 and the load 4 are shown to be three phased systems.

The inverter of the frequency converter is controlled by a control part 7. The control part controls the semiconductor switches of the inverter according to a specified control scheme for providing the motor with a desired control action, i.e. a desired speed or torque, for example. The control is based, for example, on measured values output currents and voltages. The control part may also control the switches of the rectifier if the rectifier 1 is of the type that can feed power back to the network 3.

When controlling the load, the power semiconductor components switch the DC voltage of the intermediate circuit to the load and convey the load current. During the switching of the voltage and while conveying the current, the semiconductors generate heat which has to be removed from the components. For this reason the semiconductor components are attached to cooling elements, such as heat sinks, which spread the heat to a larger mass and from there to the surrounding media, which can be air or water of a forced cooling system.

In the present invention, one or more resistive elements are attached to the cooling element to which the semiconductor component is attached. The resistive elements are used to heat the cooling element for setting a minimum temperature for the cooling element. The heat caused by the resistive element keeps the cooling element at a temperature that is above the temperature the cooling element would assume without the additional heating. Preferably, the lowest temperature of the cooling element is elevated at least by 10° C. This kind of raised temperature helps in providing advantageous effects.

Since the cooling element, such as a heat sink, is thermally in good contact with the power semiconductor component for conveying the heat generated in the component, the component also assumes readily the temperature of the cooling element generated with the resistive element. Thus the temperature set to the heat sink by the resistive element defines the temperature of the semiconductor component when the component itself does not generate heat.

The heat caused by the resistive element to the heat sink is small when compared to the heat from the component. Thus the additional heat does not affect the maximum temperature of the heat sink or the semiconductor component attached thereto in such a way that the system should be redimensioned. Thus the power that is used for heating the cooling element does not considerably affect the rating of the component or the cooling system.

Figure 2:
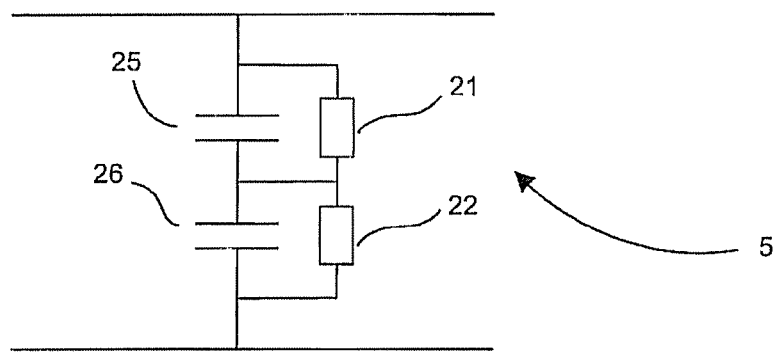
FIGS. 2, 3, 4, and 5 illustrate intermediate voltage circuits in which the invention is implemented.

According to an embodiment of the method, the resistive element attached to the cooling element is a balancing resistor. FIG. 2 illustrates an intermediate circuit of a frequency converter where two capacitors 25, 26 are connected in series between the DC voltage of the DC bus. In parallel with the capacitors, two resistors 21, 22 are provided for the purpose of balancing the voltages between the capacitors in a known manner. The voltages of the capacitors are balanced so that each of the capacitors has the same voltage. Voltage in the capacitors causes current to flow in the resistors, and thus the resistors 21, 22 discharge the voltage slowly from the capacitors. The resistors are shown in FIG. 2 to be situated near the capacitors. FIG. 2 is, however, an electrical circuit diagram, and at least one of the physical resistor elements is attached to the cooling element. When the frequency converter is powered and voltage is generated to the DC bus, current flows through the resistors, thereby producing heat in the cooling element and elevating the minimum temperature of the cooling element.

Figure 3:
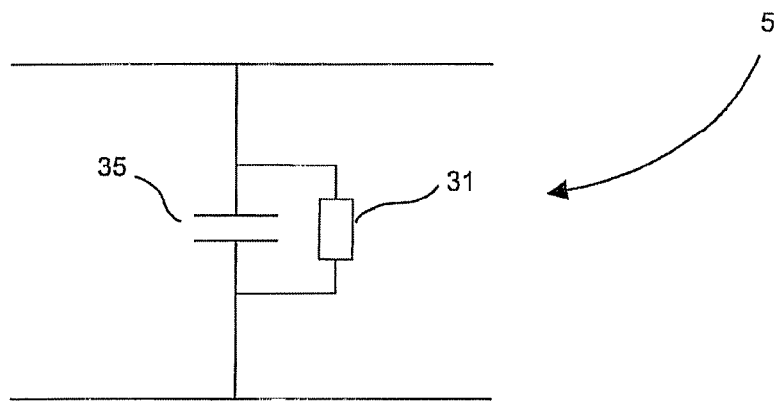

As FIG. 2, FIG. 3 also represents an intermediate circuit of a frequency converter having a capacitor 35 and a resistor 31 in parallel. The purpose of the resistor 31 is to discharge the capacitor when the power is turned down in the converter in a known manner. As can be understood, current runs through the resistor whenever the voltage of the capacitor differs from zero. According to another embodiment of the invention, this discharge resistor 31 is used as the resistive element for heating the cooling element. For this reason the discharge resistor is attached to the cooling element for maintaining an elevated minimum temperature in the cooling element.

As with the above balancing resistors, which are also effective in discharging the intermediate circuit, the discharging resistor discharges the intermediate voltage circuit continuously. Thus, current flows continuously through the resistor and the cooling element is heated.

In structures where the discharging and balancing resistors are used, dissipated power is quite small. Since, during operation of the frequency converter, the voltage of the intermediate circuit is known, the amount of power dissipated in the resistors can be designed in a simple way. The dissipated power and the lowest elevated temperature can be calculated for each heat sink separately, if desired. On the other hand, a resistance value and the temperature elevation can also be simulated or determined experimentally. It should be noted that the discharge resistors and balancing resistors may be chosen for the purpose of the invention to dissipate more power than in operation without heating. Thus the resistors can be dimensioned to heat the cooling element more effectively.

According to an embodiment of the method, the cooling element is further cooled by using forced air or forced liquid cooling with a variable flow of the cooling medium, i.e. air or liquid. The flow of the cooling medium is controlled in accordance with the load cycles of the drive. Thus in the case of air cooling, the blower that is used for forced cooling is controlled by controlling the speed of the blower. The speed is controlled to keep the temperature changes as low as possible and also to keep the rate of change of the temperature low.

This means in practice that when the temperature of the semiconductor component starts to rise, the forced cooling is used to resist the temperature change by using all or nearly all of the blower capacity, for example. When the load of the frequency converter drops, the heat generated by the semiconductor components decreases. This further means that the temperature of the component starts to decrease. In order to minimize the temperature change and change rate, the blower is controlled to a smaller rotation rate and the cooling is thus reduced.

According to an embodiment, the forced cooling is controlled to a high value when the temperature of the semiconductor component rises and to a low value when said temperature sinks. When the forced cooling is taken into account in dimensioning the cooling element, i.e. in ensuring that the temperature of the semiconductor component does not exceed the highest allowable temperature, the cooling should be used according to this dimensioning. This is to say that care should be taken that the highest allowable temperature is not exceeded although the method of the invention is applied.

The controlled forced cooling is described above with reference to air cooling where the flowing media is air and the blower motor is controlled. The same method can be similarly implemented by forced liquid cooling where the flowing media is liquid and control is achieved by controlling a pump that is used for circulating the liquid.

In the above described embodiment, the control of the cooling depends on the temperature and temperature change. The temperature of the semiconductor component can be easily measured or determined based on temperature measurements on a component, such as the heat sink, that is thermally connected to the semiconductor component. Further, the temperature of the semiconductor component can be calculated based on the current flowing through the component, voltage over the component, and switching frequency of the component.

The above controlled cooling is very effective in connection with heating of the cooling element. The heating raises the lowest obtainable temperature and the controlled cooling further minimizes the temperature variations.

Figure 4:
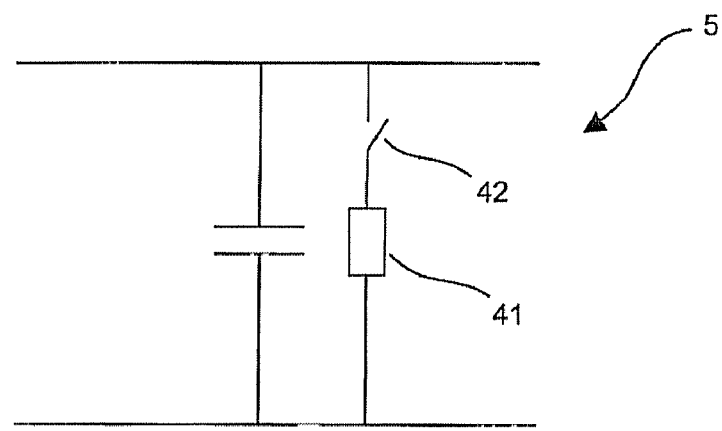

In accordance with another aspect of the invention, the resistive element is used to dissipate energy and produce heat in a controllable way in the cooling element. Thus the current in the resistive element can be switched on and off selectively. It is known in the art of frequency converters to dissipate energy from the intermediate voltage circuit for controlling the voltage of said circuit. Such actively controlled circuits are referred to as brake choppers and used for dissipating power from the intermediate circuit if the power cannot be fed to the load or to the supplying network. The power dissipation lowers the voltage level in the intermediate circuit. In the simplest form, the brake chopper is formed by a series connection of a controllable switch and a resistor connected between the rails of the intermediate voltage circuit, as illustrated in FIG. 4.

Figure 5:
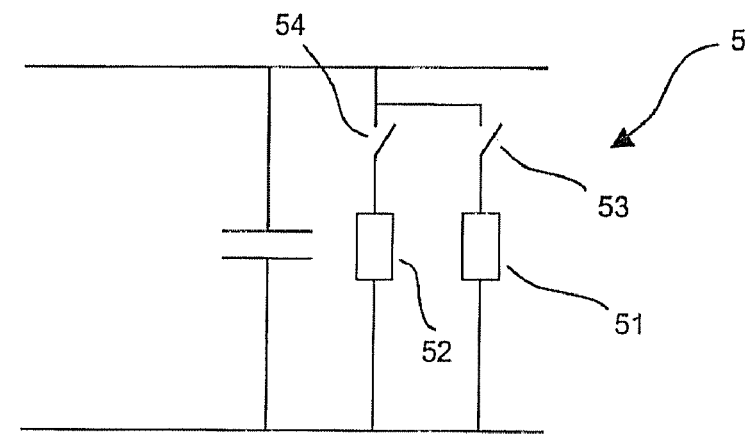

According to an embodiment of the invention, the resistive element attached to the cooling element is a resistor 41, 51 of a brake chopper. The resistive element in a brake chopper may be formed by more than one resistor, as shown in FIG. 5. In such a case, the properties of the resistor 51 attached to the cooling element can be dimensioned freely and separately from the resistor 52 used for braking. When the only or all brake resistors are used for providing the cooling element with heat according to the invention, the temperature of the cooling element can be elevated. The temperature can be raised by operating the brake chopper also in situations other than during braking. For example, the switch 42 of the brake chopper can be operated for a certain period of time in cycles or it can be operated based on a measured or estimated temperature of the cooling element or semiconductor component. The brake resistors are dimensioned to dissipate rather large amounts of power. Thus in the cyclic use of the chopper for heating the cooling element, the cycles do not need to have long conducting periods.

It should be noted that the actual braking operation overrides the heating procedure. This is to ensure that the frequency converter keeps its operation ability and does not trip to overvoltage.

As seen in FIG. 5, in an embodiment of the invention the brake chopper is formed by multiple resistors and separate controllable switches 53, 54 for the multiple resistors. Let us assume that the resistor 51 is attached to the cooling element and the resistor 52 is used solely for braking. When a braking action, i.e. lowering the intermediate voltage, is desired, the switch 54 is actuated. The switch 53 is used to control the amount of heating in the cooling element. The switches 53, 54 are thus operated independently of each other.

The use of the controllable switch 53 in connection with the resistive element 51 for producing heat in the cooling element allows the temperature of the cooling element to be varied considerably. The switch 53 can be controlled for example using pulse width modulation, where the length of the conducting periods sets the temperature elevation of the cooling element. In order to minimize the temperature variations of the semiconductor component, the temperature of the cooling element is elevated. By the embodiment of FIG. 5, the temperature of the cooling element can be set to a desired level since the power dissipated in the resistor 51 can be controlled precisely. This temperature can be set by using feedback signals from a measured or estimated temperature and controlling the conducting period of the switch 53 according to a measured value. Since the temperature control of the cooling element need not be that accurate, the temperature can be set by using prior calculated or measured dependencies between conducting periods of the switch 53 and the temperature of the cooling element, and during use, changing the duration of the conducting period of the switch for obtaining the desired temperature level.

The power dissipated in and thus the temperature of the cooling element can be changed during use in a simple manner. This allows for versatility in reducing the semiconductor stresses. The temperature of the cooling element can be for example raised or kept at a high level when the semiconductor is not loaded, and when the semiconductor is loaded, the heating obtained by the resistor can be lowered. When the sum of dissipated power in a cooling element is constant, the temperature of the cooling element is also approximately constant. Thus when the total power dissipated by the heating resistor and the semiconductor component is constant, the temperature of the cooling element should also be constant.

However, this would mean that in an ideal case, the resistive element would provide the cooling element with as much power as the power semiconductor. This would further require that the temperature of the cooling element could be lowered as fast as the temperature rises when current starts to run in the semiconductor component. If this cannot be obtained, the dissipated power from the resistive component would raise the temperature of the component above the acceptable level during the load cycle. It is thus advisable to keep the lowest temperature of the cooling element such that the additional heating does not considerably increase the highest temperature reached by the component.

As with the other embodiment, forced cooling is also used mainly to keep the highest temperatures below a certain limit. The forced cooling may also be controllable, in which case temperature variations in the semiconductor component are further minimized.

In the invention, the additional heat in the cooling element is generated with resistive means which are connected to the intermediate circuit of a frequency converter. The power dissipated in the resistor is taken from the electrical system, i.e. either from the supplying mains or, during regenerative braking, from the rotating machine. The power needed for the heating is minimal with respect to the power of the frequency converter itself, and the power converted to heat does not affect the properties of the drive.

If the variations in the temperature of a semiconductor component are to be kept as low as possible, the lowest temperature may be elevated for example by 50° C. Such an amount of temperature rise requires that the dissipated power be controlled so that during a load cycle the highest temperature of the component does not considerably exceed the highest allowable temperature.

Figure 6:
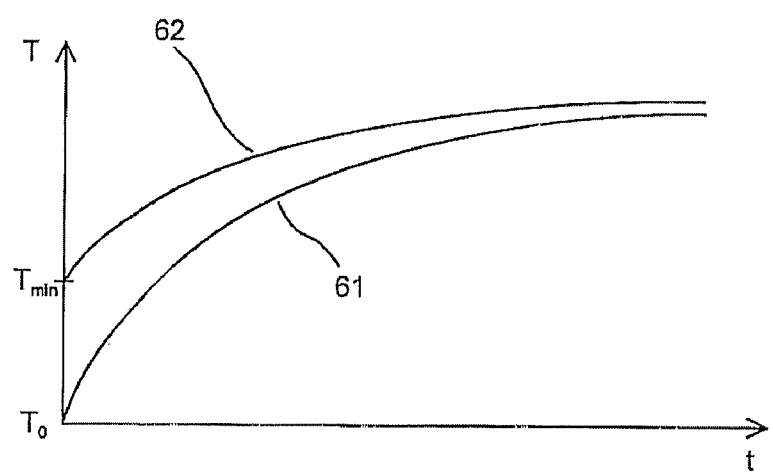
FIG. 6 shows temperature curves.

In addition to the minimized temperature variations, the invention also slows down the temperature rise rate. This is due to a larger temperature difference between the environment and the cooling element. The slower temperature change rates, in turn, reduce risks relating to thermal expansions since abrupt changes are avoided. FIG. 6 shows the temperature of a cooling plate T as a function of time t in connection with a conventional cooling element (curve 61) and in connection with the elevated temperature (curve 62). Curve 62 starts from the elevated temperature Tmin, below which the temperature does not fall. In connection with a conventional cooling element, the temperature starts to rise from temperature To when the frequency converter is loaded. It is noted about FIG. 6 that although the curves are only provided by way of examples, the temperature variation is greatly reduced by the present invention. FIG. 6 also illustrates that a temperature change from a higher starting temperature is smaller compared to temperature change from a lower starting temperature with the same heating power. Thus, even if the lowest temperature is elevated, the elevation is considerably smaller in the higher temperatures.

It will be obvious to a person skilled in the art that as technology advances, the inventive concept can be implemented in various ways. The invention and its embodiments are not limited to the examples described above but may vary within the scope of the claims.

The invention claimed is:

1. A method for reducing thermal stresses of a semiconductor component in a frequency converter wherein the semiconductor component is attached to a cooling element for cooling the semiconductor component and one or more resistive elements are attached to the cooling element, the method comprising:
heating the cooling element by the one or more resistive elements attached thereto by supplying current from the frequency converter through the one or more resistive elements for obtaining an elevated lowest temperature for the semiconductor component, and thereby reducing an amount of temperature change between highest and lowest temperatures in the semiconductor component during use of the frequency converter,
wherein the frequency converter comprises an intermediate voltage circuit and the current supplied from the frequency converter to the one or more resistive elements is supplied from the intermediate circuit.

2. The method according to claim 1, wherein the temperature of the cooling element is elevated at least by 10° C. when compared to a temperature without heating.

3. The method according to claim 1, wherein at least one of the one or more resistive elements is a discharge resistor coupled for discharging the intermediate circuit.

4. The method according to claim 3, wherein the frequency converter comprises:
forced cooling and the forced cooling is used in a controlled manner for reducing the amount of temperature change.

5. The method according to claim 1, wherein the one or more resistive elements comprise one or more balancing resistors coupled for balancing voltages of the capacitors of the intermediate voltage circuit.

6. The method according to claim 1, wherein at least one of the one or more resistive elements is a resistor and the method comprises:
controlling current through the resistor by a controllable switch.

7. The method according to claim 6, wherein the frequency converter comprises:
a brake chopper and the resistor is a resistor of the brake chopper.

8. The method according to claim 6, wherein the current through the resistor is controlled in response to a measured or estimated temperature of the cooling element or of the power semiconductor component.

9. The method according to claim 1, wherein the method comprises:
forced cooling of the semiconductor component.

10. An arrangement in a frequency converter which comprises:
a power semiconductor component, which component is attached to a cooling element for cooling the semiconductor component; and
one or more resistive elements attached to the cooling element for heating said cooling element when current is supplied through said one or more resistive elements for obtaining an elevated lowest temperature for the semiconductor component and thereby reducing an amount of temperature change between highest and lowest temperatures in the semiconductor component during use of the frequency converter, wherein the frequency converter comprises an intermediate voltage circuit for supplying the one or more resistive elements with voltage.

11. The arrangement according to claim 10, wherein the temperature of the cooling element will be elevated at least by 10° C. when compared to a temperature without heating.

12. The arrangement according to claim 10, wherein at least one of the one or more resistive elements attached to the cooling element is a capacitor discharge resistor, the capacitor being a capacitor of the intermediate circuit.

13. The arrangement according to claim 12, wherein the frequency converter comprises:
a forced cooling for providing forced cooling in a controlled manner for reducing the amount of temperature change.

14. The arrangement according to claim 10, wherein the arrangement comprises:
a controllable switch with which at least one of the one or more resistive elements is provided in series, the controllable switch being adapted to control an amount of current running through the at least one of the one or more resistive elements.

15. A frequency converter comprising:
a power semiconductor component, which component is attached to a cooling element for cooling the semiconductor component; and
one or more resistive elements attached to the cooling element for heating said cooling element when current is supplied through said one or more resistive elements for obtaining an elevated lowest temperature for the semiconductor component and thereby reducing an amount of temperature change between highest and lowest temperatures in the semiconductor component during use of the frequency converter,
wherein the frequency converter comprises an intermediate voltage circuit for supplying the one or more resistive elements are supplied with voltage.

16. The frequency converter according to claim 15, wherein the temperature of the cooling element will be elevated at least by 10° C. when compared to a temperature without heating.

17. The frequency converter according to claim 15, wherein the comprises intermediate voltage circuit comprising one or more capacitors and the one or more resistive elements are supplied with voltage of the one or more capacitors.

18. A frequency converter according to claim 15, wherein the resistive element is a balancing resistor used for balancing voltages of a series connection of intermediate voltage circuit capacitors.

19. The frequency converter according to claim 18 wherein the frequency converter comprises:
a forced cooling for providing forced cooling in a controlled manner for reducing the amount of temperature change.

20. The frequency converter according to claim 15, wherein at least one of the one or more resistive elements is a discharging resistor used for discharging the intermediate voltage circuit capacitor.

21. The frequency converter according to claim 15, wherein at least one of the one or more resistive elements resistive element is a resistor and the frequency converter comprises:
in series with said resistor, a controllable switch as a series connection connected between the intermediate voltage circuit, whereby said controllable switch is adapted to control the current through the resistor.

22. The frequency converter according to claim 21, wherein the series connection of the controllable switch and the resistor is a brake chopper.

23. The frequency converter according to claim 21, wherein the series connection of the controllable switch and the resistor is connected in parallel with a brake chopper.

24. The frequency converter according to claim 15, wherein the frequency converter comprises:
a forced cooling in connection with the cooling element, which forced cooling is arranged to be controllable.

* * * * *